United States Patent [19]

Bhattacharyya et al.

[11] Patent Number: 4,771,018

[45] Date of Patent: Sep. 13, 1988

[54] PROCESS OF ATTACHING A DIE TO A SUBSTRATE USING GOLD/SILICON SEED

[75] Inventors: Bidyut K. Bhattacharyya, Chandler, Ariz.; Eric S. Tosaya, San Jose, Calif.

[73] Assignee: Intel Corporation, Santa Clara, Calif.

[21] Appl. No.: 27,638

[22] Filed: Mar. 19, 1987

Related U.S. Application Data

[62] Division of Ser. No. 873,539, Jun. 12, 1986, abandoned.

[51] Int. Cl.$^4$ .................. H01L 23/36; H01L 21/304; B01J 17/00

[52] U.S. Cl. ........................... 437/209; 148/DIG. 12; 148/DIG. 62; 29/843; 228/208; 228/238; 437/216; 437/245; 437/247

[58] Field of Search ................ 29/589, 588, 580, 583, 29/840, 843; 357/71, 81, 67, 80; 228/208, 209, 210, 238; 437/180, 209, 190, 245, 246, 247; 148/DIG. 12, DIG.62

[56] References Cited

U.S. PATENT DOCUMENTS

| | | | |
|---|---|---|---|
| 3,298,093 | 1/1967 | Cohen | 29/589 |
| 3,585,711 | 6/1971 | Hicks | 29/590 |
| 3,593,412 | 7/1971 | Foote | 228/209 |
| 3,883,946 | 5/1975 | Dale | 29/589 |
| 4,026,008 | 5/1977 | Drees et al. | 29/574 |
| 4,141,135 | 2/1979 | Henry et al. | 29/580 |
| 4,160,308 | 7/1979 | Courtney et al. | 29/588 |
| 4,396,971 | 8/1983 | Beall et al. | 357/81 |
| 4,463,059 | 7/1984 | Bhattacharyya et al. | 357/80 |
| 4,620,215 | 10/1986 | Lee | 357/81 |

OTHER PUBLICATIONS

H. F. Gray, "Some Basic Problems with Eutectic Preform ... ", Naval Research Laboratory; Abst. No. 19, pp. 51-52.

Linn et al., "Analysis of Gold Films Used in Microcircuit Chip ... ", Applied Surface Science, 26, (1986), pp. 211-218.

Aldersley, "Void Reduction in Gold-Silicon Eutectic Die Bonding", Benn. Electronics Publications, 1982, pp. 136-142.

Mencinger et al., "Use of Wetting Angle ... Au-Si Eutectic Die Attach", IEEE, New York, VIII, pp. 173-179, 1985.

Hoge et al., "Some Considerations of the Gold-Silicon Die Bond ... ", IEEE, IEDM, 1980, pp. 303-311.

Nowicki et al., "Studies of CrN-Au, as an Improved Die Attach ... ", Thin Solid Films, 83, (1981), pp. 209-216.

Primary Examiner—Brian E. Hearn
Assistant Examiner—William D. Bunch
Attorney, Agent, or Firm—Blakely, Sokoloff, Taylor & Zafman

[57] ABSTRACT

An improved method for eutectically bonding a silicon wafer onto a gold preform is described. A gold/silicon seed is placed on a pure gold preform. Then a die is placed onto the pure gold preform and the gold/silicon seed, wherein the seed acts as a catalyst to form an eutectic bond.

3 Claims, 4 Drawing Sheets

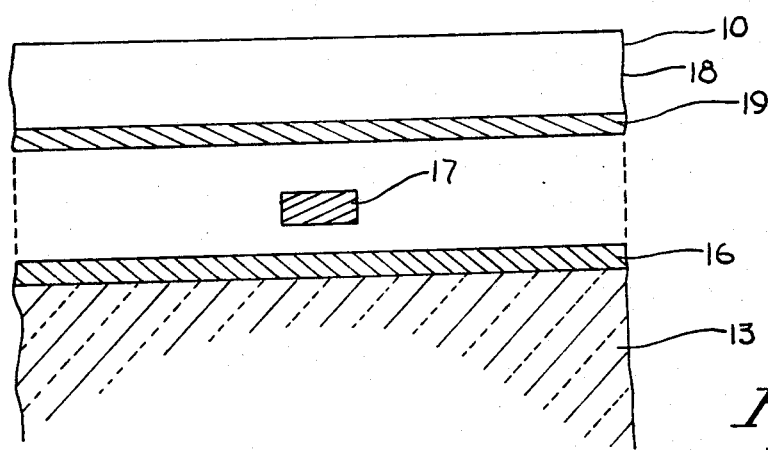
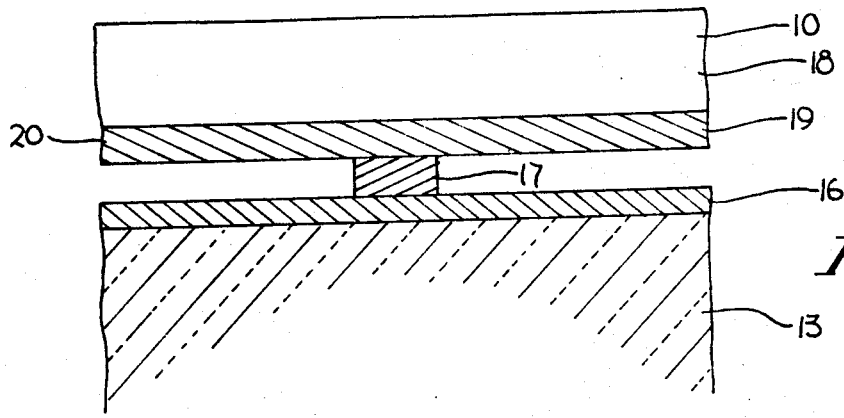
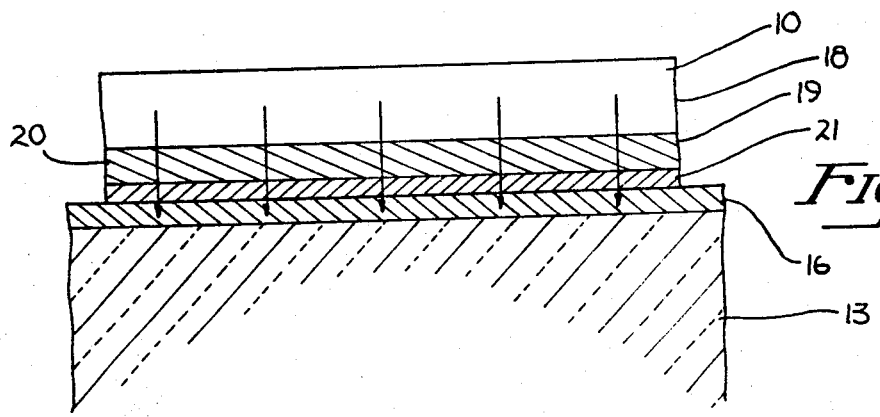

PROCESS OF ATTACHING A DIE TO A SUBSTRATE USING GOLD/SILICON SEED

This is a divisional of application Ser. No. 873,539 filed June 12, 1986, now abandoned.

BACKGROUND OF THE INVENTION

1. Field of the Invention.

The present invention relates to an improved method of bonding a semiconductor chip to a dielectric body, such as a header, and more specifically, to providing an eutectic bond between a silicon chip and a package.

2. Prior Art.

Semiconductor fabrication usually requires a bonding of a semiconductor device, such as a silicon chip, to a packaging element. Various bonding methods, well-known in the prior art, are available to teach the bonding of the chip to the package. One general technique employs the use of gold (Au) of gold/silicon (Au/Si) alloy as a bonding medium for bonding the silicon chip to the package. Such bonding methods are described in U.S. Pat. Nos. 3,316,628; 3,585,711; 3,593,412; 4,454,528; and 3,298,093.

Although gold melts at approximately 1100 degrees C. and silicon melts at above 1400 degrees C., it is known that a gold/silicon eutectic alloy melts at approximately 400 degrees C. Therefore, the placing of the one element, gold, in proximity of the second element, silicon, causes a transmigration of atomic particles and when heated to approximately 400 degrees C., a Au/Si eutectic bond forms between the two elements. The above-named patents recite processes which utilizes property of the Au/Si alloy.

In addition, it is well-known in the prior art that an intermediate metal interposed between the silicon and the gold normally operates as a diffusion barrier which limits the amount of oxidation of the silicon. However, when heated, the increase in thermal energy causes a breakdown of the diffusion barrier and allows the Au/Si bonding to occur.

Therefore, it is a well-known process in the semiconductor industry to prepare a package surface where the bonding is accomplished by depositing gold on that surface. Then, preparing the die which includes a silicon chip, an intermediate metal, and gold on the surface of the intermediate metal, and placing the die onto the preform wherein the intermediate metal makes contact on the preform. Next, forcing the die by scrubbing at a temperature near the Au/Si eutectic melting point which causes the Au/Si eutectic bond to occur.

However, as the physical size of the silicon wafers increased, problems were encountered in the basic die attachment process. Die sizes of 0.200×0.200 inches and larger have historically been difficult to die attach due to wafer backside variations. Wafer backside variations occur because it is difficult to maintain a uniform thicknes of the intermediate metal and this non-uniformity is multiplied in wafers having larger than 0.200×0.200 inch dimension.

The non-uniformity of the backside variation causes a non-uniformity of heat transfer resulting in non-uniform breakdown of the diffusion barrier. Therefore, if the temperature is too low, certain surfaces of the die will bond but portions may result in fast solidification (depending on the amount of Si flowing from the Si die) resulting in formation of voids. To compensate, the temperature may be raised to a level which assures diffusion barrier breakdown over the total area, but it has been found that temperatures above 500 degrees C. tend to crack the die due to thermal stress during subsequent cooling cycles and also produces metal "spiking".

What is needed is an improved Au/Si eutectic bonding process which may be performed at lower temperatures to prevent voids and cracks, yet provide for a bond over the complete surface area of a semiconductor wafer die having a dimension larger than 0.200×0.200 inches.

The present invention addresses this need and was invented and developed to overcome the problem of larger die attachment, such problem being well-known in the semiconductor industry.

SUMMARY OF THE INVENTION

A novel method for attaching a silicon semiconductor wafer onto a dielectric body is described. The method involves placing a pure gold preform on the body. Then a Au/Si seed preform is placed on the gold preform. Next a die is placed on the seed and the preform, then gently scrubbed at approximately 400 degrees C. The Au/Si seed melts at the eutectic temperature of Au/Si alloy which is at approximately 367 degrees C. The melted Au/Si forms a liquid layer and acts as a catalyst in transmitting thermal energy from the gold to the silicon, wherein silicon atoms combine with the gold preform and form a eutectic bond.

BRIEF DESCRIPTION OF THE DRAWINGS

FIG. 2 is a cross-sectional view showing the elements of FIG. 1.

FIG. 3 is a cross-sectional view showing the elements of FIG. 1 in position prior to the scrubbing operation.

FIG. 4 is a cross-sectional view showing the formation of an Au/Si eutectic bond of the die and preform of FIG. 1.

DETAILED DESCRIPTION OF THE PRESENT INVENTION

The present invention describes a method of bonding a silicon semiconductor wafer to a gold preform situated on a packaging body. In the following description, numerous specific details are set forth such as specific thicknesses, dimensions, temperatures, etc., in order to provide a thorough understanding of the present invention. It will be obvious, however, to one skilled in the art that the present invention may be practiced without these specific details. In other instances, well-known processes have not been described in detail, in order not to unnecessarily obscure the present invention.

Figure 1:
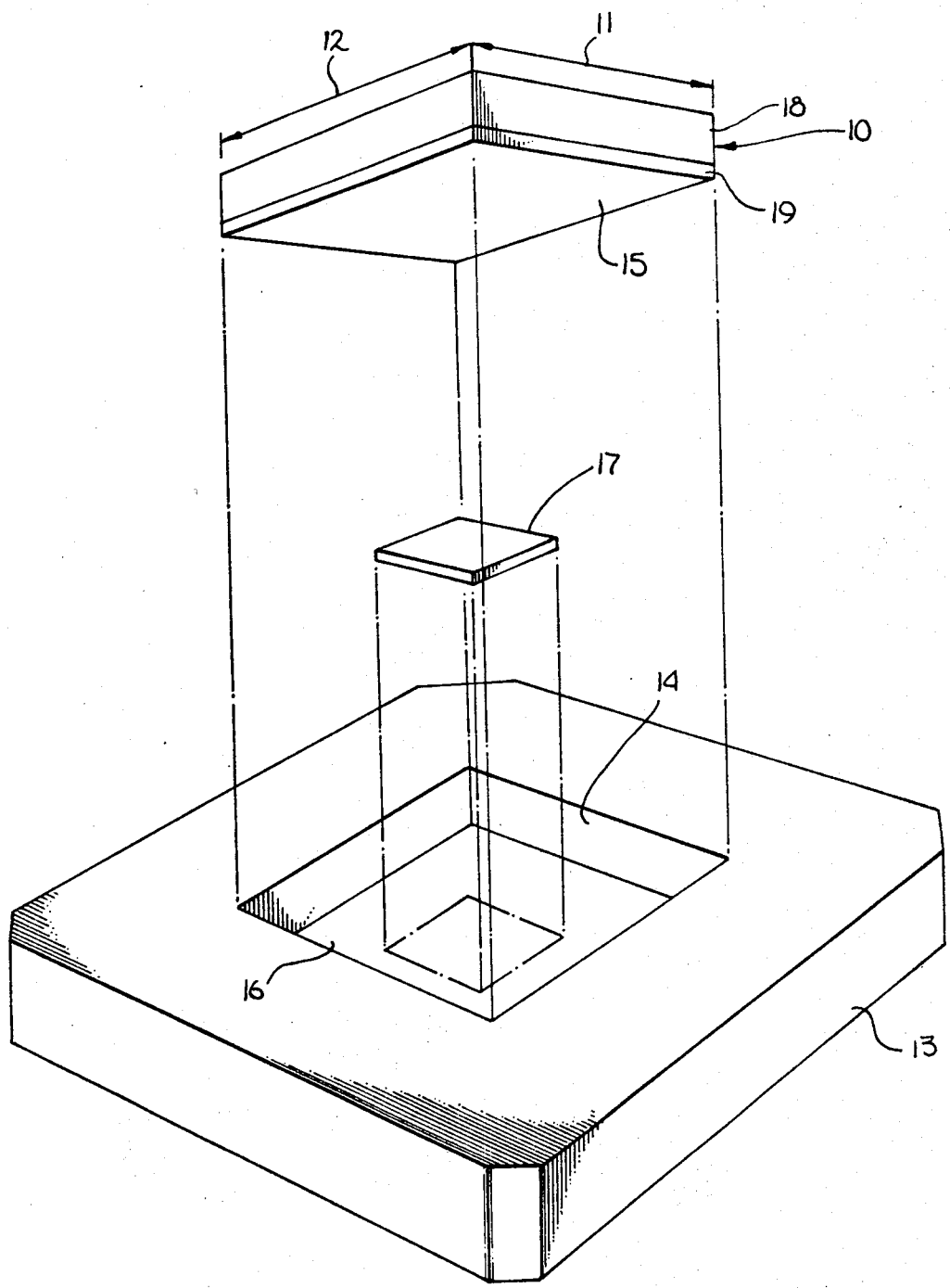
FIG. 1 is a plan view showing a placement of a semiconductor die and a Au/Si seed onto a gold preform located in a dielectric package.

Referring to FIG. 1, a die 10 having a length 11 and a width 12 is shown. Also shown is a body 13 having a receptacle 14 for accepting die 10. Body 13 is comprised of a dielectric material, such as a ceramic, which is well-known in the prior art as materials used for semiconductor packaging. Die 10 which includes a silicon chip 18 and intermediate metal 19 will have a surface, such as a bottom surface 15, mounted to a pure gold preform 16 which is located within receptacle 14. Typically, the present invention is for dies having a length 11 and width 12 dimensions of 0.200×0.200 inches or larger, although the present invention may be used with smaller dies. A seed preform 17, comprised of a Au/Si eutectic alloy, is shown placed between preform 16 and die 10. In the preferred embodiment, preform 17 is of such size that it makes contact with 10-20% of the surface area of preform 16. The die 10 is placed on the body 13 which is heated to a predetermined temperature, and nitrogen gas is also injected in a process, which is well-known in the prior art for bonding die 10 to body 13.

The die 10 and body 13 is better shown in the cross-sectional illustration of FIG. 2. A portion of the preform 16 is shown attached to body 13. The preferred embodiment has the preform 16 deposited on body 13 by prior art deposition means. Other means known in the prior art may also be used to provide for an attachment of preform 16 to body 13. In the preferred embodiment, the preform 16 is comprised primarily of gold.

Next, a seed preform 17 is placed on preform 16. Thereafter, the die 10 is positioned such that intermediate metal 19 makes contact with seed 17. The purpose of the intermediate metal 19 is to prevent the oxidation of the silicon chip 18 prior to placement of die 10 in the chamber. In the preferred embodiment, the intermediate metal is comprised of chromium layer 20.

FIG. 3 shows the placement of the various units once in the chamber. The temperature is raised to approximately 400 degrees C. A force is placed on the die in the preforms by scrubbing the die in relation to the preform. When the melting point of Au/Si eutectic alloy is reached (at approximately 367 degrees C.), the Au/Si seed 17 melts.

Referring to FIG. 4, the melted Au/Si having a liquid form freely flows during the scrubbing operation resulting in the formation of a Au/Si layer 21. The liquid Au/Si layer 21 spreads across the surface of the Au preform 16 and chromium layer 20. Layer 21 basically acts as a catalyst in transferring thermal energy to die 10. The thermal energy "washes" away the chromium diffusion barrier and allows silicon atoms within wafer 18 to penetrate to Au layer 16, as shown by arrows 22. Silicon atoms will then combine with gold and layer 16 and further increase the amount of Au/Si alloy of layer 21, therein forming a Au/Si eutectic bond between the die 10 and preform 16.

Figure 5:
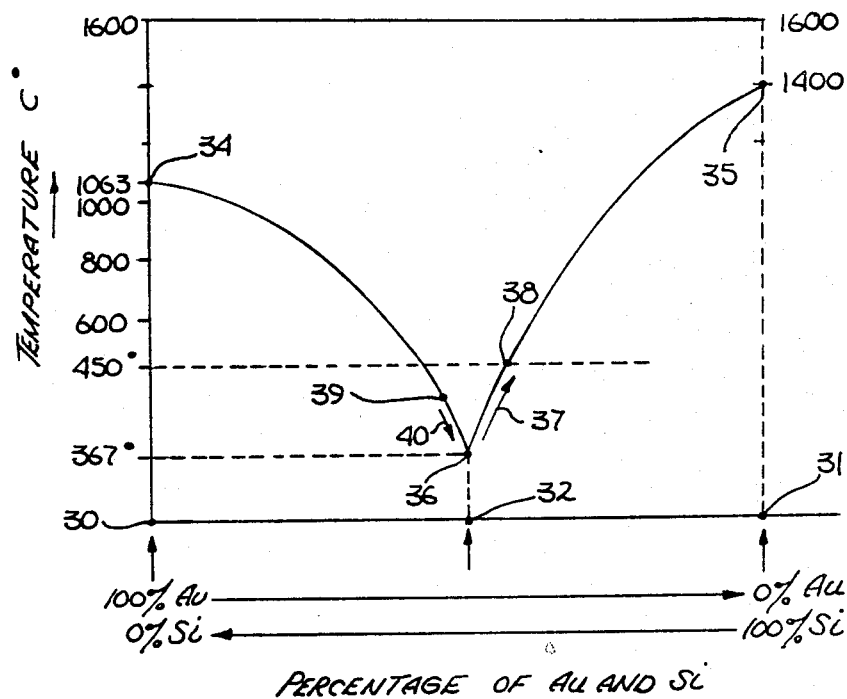
FIG. 5 is a graphic representation of a Au/Si eutectic melting temperature as a function of gold and silicon concentration in an Au/Si alloy and the improvement of using a Au/Si seed of the present invention over prior art Au/Si preforms.
Figure 6:
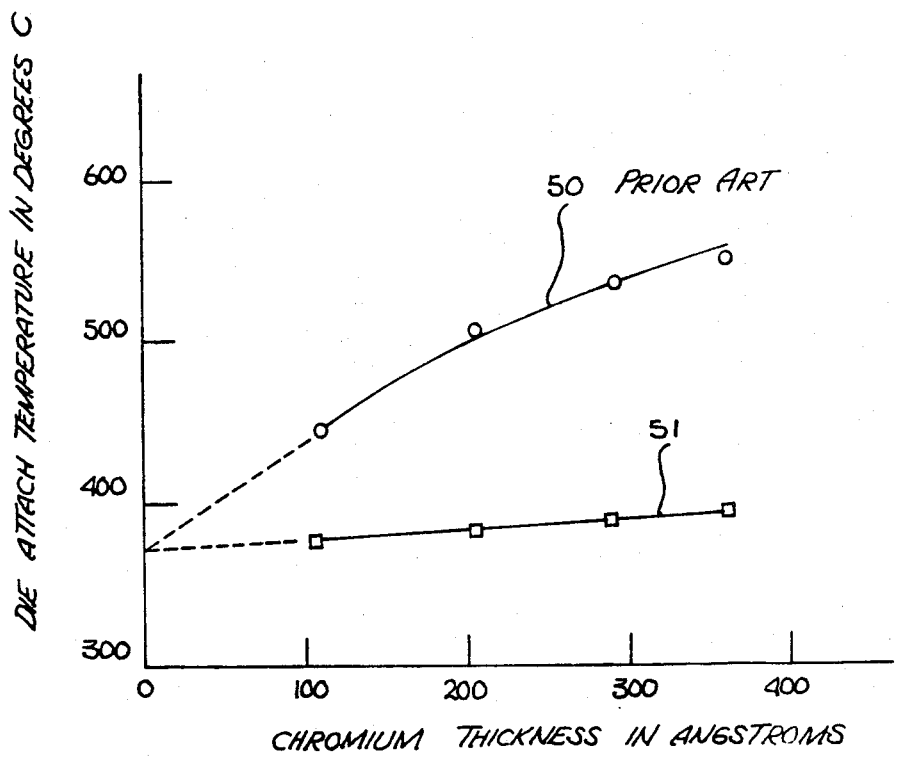
FIG. 6 is a graphic representation of a chromium diffusion breakdown temperature as a function of chromium thickness of the present invention over prior art.

A distinct advantage of the present invention is illustrated in FIGS. 5 and 6. In FIG. 5, the ordinate axis represents temperature in celsius. The abscissa represents the concentration of Au and Si atoms in the Au/Si alloy. An origin 30 represents a condition where it is pure Au and the percentage of Au in the alloy decreases as point 31 is approached, wherein at point 31, the percentage of Au in the alloy is zero. In reverse, Si concentration is 100% at point 31 and decreases until zero percent is reached at the origin. At point 32, the percentage of Au and Si in the alloy is approximately equal and this point 32 corresponds to the lowest melting point of a Au/Si alloy.

Curve 33 is drawn by having end points 34 and 35, wherein point 34 represents melting point of Au at approximately 1100 degrees C. and point 35 represents melting point of Si at approximately 1400 degrees C. The curve is then drawn by determining the eutectic melting point of Au/Si alloy as various concentration levels of the two elements are obtained. Point 36 represented by a concentration percentage of point 32 has the lowest eutectic melting point of 367 degrees C.

In prior art methods where Au/Si preforms are used to bond to a Si die, the Au/Si preform initially melts at 367 degrees C. As more Si atoms transfer to the Au/Si preform, the concentration of Si atoms increases in the Au/Si perform and the eutectic melting point begins to move along the curve as shown by arrow 37. Assuming that the chamber temperature is set at 450 degrees C. in this particular hypothetical example, the bonding process will continue until Si concentration reaches a level wherein the eutectic melting point of the alloy is raised to 450 degrees C. as shown by point 38. At this point 38, the bonding process stops.

To alleviate this problem, prior art methods have attempted to use higher chamber temperatures, a parameter which is critical in large dies as earlier mentioned. Also, prior art methods have attempted to control the concentration of Au and Si in the Au/Si preform, however, such critical tolerances are costly or difficult to achieve.

The present invention overcomes the above problem simply by using a Au preform and a Au/Si seed. When the Au/Si seed melts in the chamber, the seed is lessened in volume in comparison to the Au preform. At the moment of the melting of the Au/Si seed, the concentration of Si is low in comparison to the Au atoms in the Au/Si seed and the Au preform. Hence, at the instant the seed melts, the eutectic melting point is approximately shown by point 39 on curve 33. Then, as the diffusion barrier lessens and as more Si atoms intermix with the Au preform, the eutectic melting point moves from point 39 toward point 36 as shown by curve 40. After reaching point 36, the melting point will transition toward point 38 as was the case with the prior art method.

Therefore, as illustrated by curve 33, the present invention permits an extended range where the eutectic melting point is kept below the chamber temperature allowing for more Si atoms to combine with the Au to form a stronger eutectic bond. This result is achieved by a simple seed and requires no critical parameter tolerances. The end result is also achieved with lower chamber temperatures.

Referring to FIG. 6, a further improvement of the present invention over another prior art method is shown. In prior art methods where a die, having an intermediate seal, is bonded to a pure Au preform, FIG. 6 shows the improvement of the present invention. In FIG. 6, the ordinate axis represents temperature in Celsius. The abscissa represents the thickness of chromium in angstroms. Chromium is used as an example of the intermediate metal in this instance and the values on the graph represent such. Although the preferred embodiment uses chromium, any other intermediate metal will respond equivalently.

Curve 50 is a prior art curve showing the temperature at which chromium diffusion barrier occurs at various thicknesses of chromium intermediate metal located between a Au preform and a Si wafer. As exemplified by curve 50, the barrier breakdown temperature (where chromium "washout" occurs) increases noticeably with chromium thickness.

However, where Au/Si seed is placed between the die and Au preform, the resulting difference over prior art is shown in Curve 51. In Curve 51, the temperature at which diffusion barrier breakdown occurs is significantly lower than the prior art curve 50. More importantly, in curve 51, the chromium diffusion breakdown temperature (T) is practically independent of the thickness (t) of chromium. Mathematically, dT/dt (derivative of temperature to thickness) is independent of the intermediate metal thickness.

Therefore, with the present invention a die may be manufactured where the thickness of the chromium need not be controlled tightly. Considering that the thickness of the chromium at 400 A is composed of approximately 20 atomic layers, a tight tolerance to maintain a uniform chromium thickness is difficult to achieve, especially in large wafers. The present invention precludes the need for such tight chromium thickness tolerances.

Figure 7:
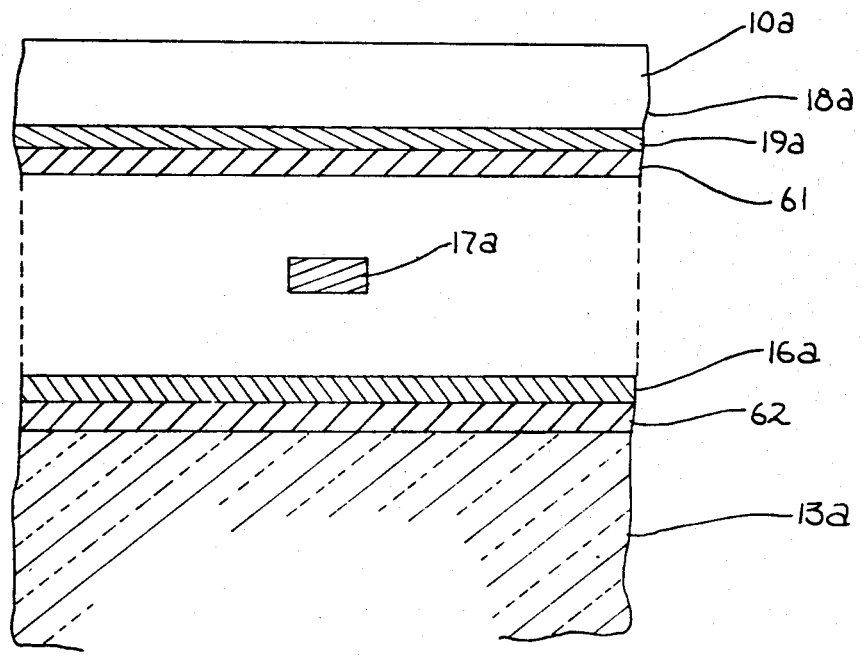
FIG. 7 is a cross-sectional view of an alternate embodiment using an additional gold metallization layer in the die and package of FIG. 2.

An alternate embodiment of the present invention is illustrated in FIG. 7. Referring to FIG. 7, a die 10a which includes a silicon chip 18a and intermediate metal 19a is illustrated. In the reference symbols, letter "a" has been added to reference symbols of FIGS. 2-4 to show equivalency between the elements of the two embodiments.

Die 10a also has a gold layer 61 deposited on intermediate metal 19a. A body 13a comprised of a dielectric material, such as ceramic, has a gold layer 62 deposited onto it. Then a pure gold preform 16a is placed on layer 62.

Next, a seed preform 17a, comprised of a Au/Si eutectic alloy, is placed on preform 16a. Thereafter, the die 10a is positioned such that intermediate metal 19a and gold layer 61 makes contact with seed 17a.

This alternate embodiment is equivalent to the earlier embodiment except for the addition of Au layers 61 and 62. Layer 62 aids in the placement of preform 16a onto body 13a and Au layer 61 aids in the initial bonding stage of die 10a to body 13a. However, the actual die attachment technique does not differ from the description given for the earlier embodiment.

Although the present invention is disclosed using one particular intermediate metal, chromium, the intermediate metal could be comprised of another element, alloy or combination of several layers.

Thus, a novel technique of using a Au/Si seed to attach a Si wafer to a Au preform is disclosed. The present invention is extremely useful in applications involving bonding of Si wafers of 0.200×0.200 inches or larger.

We claim:

1. A method for bonding a semiconductor die having a planar size of at least 0.200×0.200 inches. onto a dielectrically insulated body, said die having a silicon chip and an intermediate barrier metal comprising the steps of:

(a) depositing a gold layer on said dielectrically insulated body;
   (b) placing a pure gold preform on said gold layer;
   (c) placing a gold/silicon seed comprised of a gold/silicon eutectic alloy, having a lower percentage of silicon than gold, on said deposited gold preform, wherein said gold/silicon seed contacts approximately 10-20% of a surface of said pure gold preform;
   (d) placing said die on said gold/silicon seed such that said intermediate barrier metal contacts said gold/silicon seed;
   (e) heating said gold preform and gold/silicon seed; and
   (f) scrubbing gently said die on said gold/silicon seed at a bonding temperature of approximately 400° C. such that said gold/silicon seed melts and forms a liquid layer which acts as a catalyst for further transfer of thermal energy from said pure gold preform to said die;
   continued scrubbing of said die causes silicon atoms from said chip to penetrate said intermediate barrier metal and combine with said gold/silicon liquid layer wherein said percentage of silicon increases causing eutectic melting point of said gold/silicon layer to decrease;
   said scrubbing is initiated at a eutectic melting point of gold/silicon having an initial value greater than the minimum melting temperature of gold/silicon, but continued scrubbing causes said eutectic melting point to decrease in value until said minimum value is reached at which time further reaction of silicon from said chip increases percentage of silicon in comparison to gold causing said eutectic melting point to increase until said eutectic melting point reaches said bonding temperature, wherein silicon atoms in said die migrate across said intermediate barrier metal to said gold preform and form a gold/silicon eutectic bond.

2. The method as defined in claim 1, wherein said intermediate barrier metal is comprised of chromium and said bonding is substantially independent of thickness of said intermediate metal.

3. The method as defined in claim 2, wherein said die having a second gold layer deposited on said intermediate barrier metal, such that said second gold layer makes contact with said gold/silicon preform.

* * * * *